United States Patent
Hirai et al.

(10) Patent No.: US 6,308,894 B1
(45) Date of Patent: Oct. 30, 2001

(54) IC MODULE, METHOD OF MANUFACTURING THE SAME AND IC CARD PROVIDED WITH IC MODULE

(75) Inventors: Minoru Hirai; Shigeyuki Ueda; Osamu Miyata; Tomoharu Horio, all of Kyoto (JP)

(73) Assignee: Rohm & Co., Ltd., Kyoto (JP)

( * ) Notice: Subject to any disclaimer, the term of this patent is extended or adjusted under 35 U.S.C. 154(b) by 0 days.

(21) Appl. No.: 09/147,815

(22) PCT Filed: Jul. 13, 1998

(86) PCT No.: PCT/JP98/03141

§ 371 Date: Mar. 12, 1999

§ 102(e) Date: Mar. 12, 1999

(87) PCT Pub. No.: WO99/04365

PCT Pub. Date: Jan. 28, 1999

(30) Foreign Application Priority Data

Jul. 18, 1997 (JP) .................................................. 9-193842

(51) Int. Cl.[7] .................................................. G06K 19/06
(52) U.S. Cl. ............................................ 235/492; 235/487
(58) Field of Search ........................................ 235/487, 492; 343/872, 873, 895

(56) References Cited

U.S. PATENT DOCUMENTS

| | | | |
|---|---|---|---|
| 4,004,133 | * | 1/1977 | Hannan et al. ...................... 235/61.7 |
| 4,222,516 | * | 9/1980 | Badet et al. .......................... 235/492 |
| 4,460,825 | * | 7/1984 | Haghiri-Tehrani et al. ......... 235/488 |
| 4,511,796 | * | 4/1985 | Aigo ..................................... 235/492 |
| 4,603,249 | * | 7/1986 | Hoppe et al. ......................... 235/492 |
| 4,663,519 | * | 5/1987 | Bland .................................... 235/492 |
| 4,727,246 | * | 2/1988 | Hara et al. ............................ 235/488 |
| 4,999,742 | | 3/1991 | Stampfli ................................ 361/400 |
| 5,399,847 | * | 3/1995 | Droz ...................................... 235/488 |
| 5,585,618 | | 12/1996 | Droz ...................................... 235/492 |
| 5,837,992 | * | 11/1998 | Onozawa ............................... 235/488 |
| 5,849,230 | * | 12/1998 | Murohara .............................. 264/138 |
| 6,021,949 | | 2/2000 | Boiron .................................. 235/492 |
| 6,025,054 | * | 2/2000 | Tiffany, III .......................... 428/189 |

FOREIGN PATENT DOCUMENTS

| | | |
|---|---|---|
| 89 09 783 | 10/1990 | (DE) . |
| 64-27756 | 2/1989 | (JP) . |
| 7-89274 | 4/1995 | (JP) . |
| 96/03712 | 2/1996 | (WO) . |

* cited by examiner

Primary Examiner—Karl D. Frech
Assistant Examiner—Jamara A Franklin
(74) Attorney, Agent, or Firm—Arent Fox Kintner Plotkin & Kahn

(57) ABSTRACT

In the method of manufacturing an IC module (1) including a resin packaging process using upper and lower dies (5) for forming a cavity (50) while the dies are clamped, the resin packaging process is carried out by introducing a melted resin while a substrate (2) on which an IC chip (3) is placed and a coil (20A) which has a doughnut shape when observed from above and is flattened as a whole are housed in the cavity (50). When a substrate (2) on which an antenna coil (20) is patterned is to be packaged with a resin, the resin packaging process is carried out by forming a spacer (28) having an equal and almost equal height to the height of the cavity (50) on the substrate (2), housing it in the cavity (50), and introducing a melted resin. Instead of forming the spacer (28) on the substrate (2), a substrate (2) housed in a cavity (50) may be sucked. The manufacturing method can provide good protection of an IC chip and an antenna coil.

4 Claims, 12 Drawing Sheets

IC MODULE, METHOD OF MANUFACTURING THE SAME AND IC CARD PROVIDED WITH IC MODULE

TECHNICAL FIELD

The present invention relates to an IC card, such as an "ID card," provided with an information storage function by containing an IC chip, an IC card module incorporated in the IC card and including an IC chip, and a method of manufacturing the module.

BACKGROUND ART

As is well known, there are cards with an information storage function. Some of them store information by magnetic stripes and others are "IC cards" including IC memories.

Advantageously, such cards are suitably firmed as "non-contact type information storage cards" and, when compared with magnetic stripe type cards, they can easily be increased in information storage capacity and are highly effective in preventing forgery. It is therefore expected to achieve IC cards having a higher information processing or communication function by incorporating memory chips, CPUs and the like with increased storage capacity into the cards. In the future, it is expected that the IC cards be utilized as telephone cards or tools for carrying information on electronic money.

For example, the non-contact type IC card is a card in which an antenna coil (hereinafter, referred to as a "coil") formed by winding a metallic wire, for example, is electrically connected to an IC chip and buried in the card body made, for example, of plastic, or a card in which a substrate on which an IC chip is placed and an antenna coil is patterned is buried in the card body. In this kind of IC cards, the antenna coil functions as an antenna for transmitting and r(receiving radio waves to and from the outside and also functions as a coil for generating electromotive force to be supplied to the IC chip. Therefore, the IC card of this type has an advantage that incorporation of a power supply such as a battery is not required.

In the future, not only IC cards but such cards that are formed to contain IC chips to provide special functions are required to be increasingly thinner. Then, it can not be expected but that the force caused by a user's handling or the force received from the transportation system of a mechanical card reader causes such thin cards to bend to some extent. A problem in this case is influences on a built-in IC chip when the IC card bends. Since the IC chip is built in the plastic card as described above, stress tends to be caused, when the card bends, at a portion where the IC chip is incorporated. In this case, the IC chip may be stripped out of a prescribed interconnection pattern or the IC chip itself may be damaged. In other words, a power supply path to the IC chip may be cut stopping supply of power, the contents stored in the IC chip may be lost, and so on. That may result in a situation where the properties inherent in IC chips are eliminated. Accordingly, effective protection of the IC chips incorporated in the IC cards is further required as the IC cards are made thinner.

Therefore, by resin molding using dies such as injection molding and transfer molding, a substrate on which an IC chip is placed has been packaged, together with an antenna coil, with a resin so that they form a module. However, the following disadvantages have been caused in the resin packaging process.

Firstly, when a coil is used as an antenna coil and a substrate 2 on which an IC chip 3 is placed is packaged together with the coil with a resin, disadvantages have been caused as described below.

Figure 18:
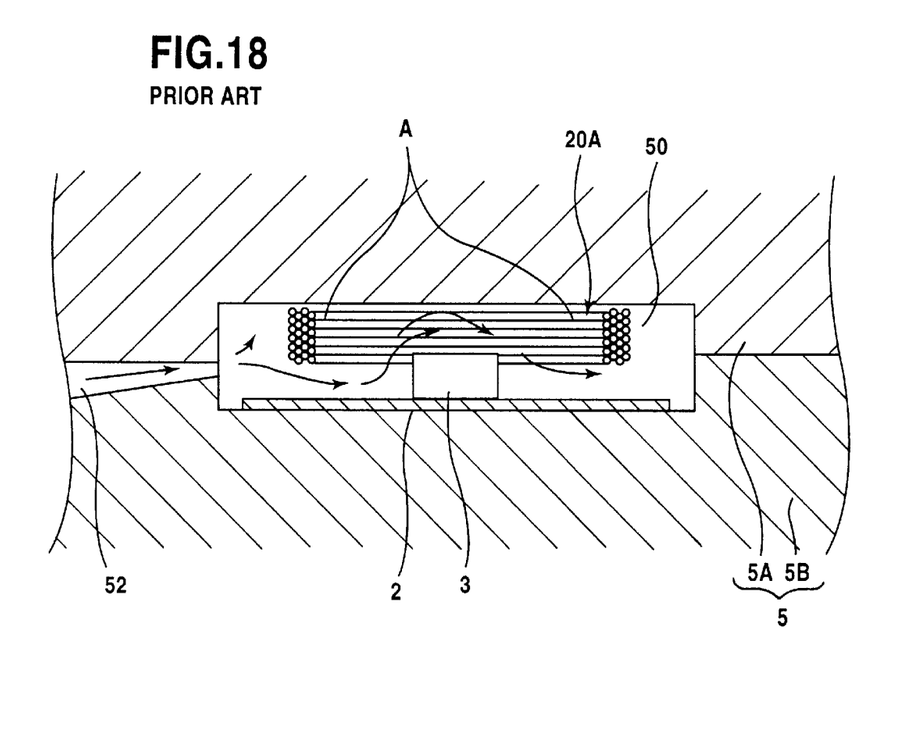
FIG. 18 is a view for describing a conventional resin packaging process.

As shown in FIG. 18, when a coil 20A is packaged together with substrate 2 with a resin, coil 20A is housed tog(ether with substrate 2 on which IC chip 3 is placed in a cavity 50 formed by upper and lower dies 5A, 5B so that they surround IC chip 3 and substrate 2. Here, coil 20a is formed by winding a metallic wire around a column-shaped rod, for example, several tens of times to ensure a desired function. Since the formation is carried out by increasing the number of winding times in the thickness direction because it is easy to perform, the thickness has been large. When a melted resin is introduced into cavity 50 through gate 52, therefore, the large thickness of coil 20A blocks the melted resin introduced from gate 52, thus preventing flow of the melted resin in cavity 50. Since the melted resin is relatively viscous, the resin lifts coil 20A upward and forms a flow path in a lower portion of coil 20A, as shown by the arrow, when the melted resin flows in cavity 50. Thus, the melted resin hardly diffuses in the region denoted by the character A and it causes a void and a pinhole. When the resin sets while coil 20A is lifted upward, coil 20A may be exposed from the surface of the resin package or it may easily be exposed, and therefore coil 20A is easily damaged.

Secondly, when an antenna coil formed by patterning copper on substrate 2 formed, for example, of a resin film is adopted as antenna coil 20A and packaged with a resin, disadvantages have been caused as described below.

Figure 19:
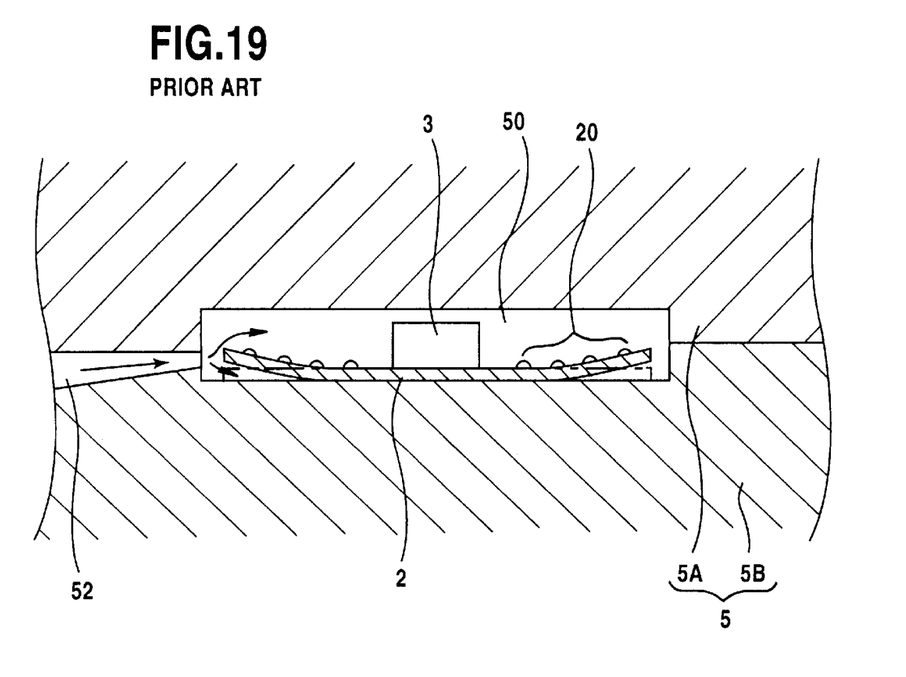
FIG. 19 is a view for describing another conventional resin packaging process.

As shown in FIG. 19, when IC chip 3 is housed together with substrate 2 in cavity 50 so as to package IC chip 3 and substrate 2 with a resin, dies 5 are preheated, and therefore substrate 2 tends to be thermally expanded. Since antenna coil 20 is spirally patterned on substrate 2 using copper which is lower in coefficient of thermal expansion than substrate 2, expansion of substrate 2 is hindered by antenna coil 20 and substrate 2 is warped in a dish shape as a result. When a melted resin is introduced into cavity 50 in this situation, the melted resin flows under the back surface of substrate 2 as shown by the arrow in the drawing. Since the melted resin is relatively viscous, the melted resin which flows under the back surface of substrate 2 may lift substrate 2 upward. If the melted resin sets in this situation, IC chip 3 may be exposed from the surface of the resin package or it may easily be exposed. Thus, IC chip 3 is susceptible to damages.

DISCLOSURE OF INVENTION

The present invention is intended to eliminate the conventional problems described above and its object is to provide a technique capable of providing good protection of an IC chip and an antenna coil.

An IC module for achieving the object above in a first aspect of the present invention, formed by packaging, with a resin, a substrate, an IC chip placed on the substrate, and a coil formed of a metallic wire, is characterized in that the coil is electrically connected to the IC chip and is flattened as a whole.

In a preferred embodiment, the cross section of the coil perimeter portion is formed to a tapered shape which decreases in thickness toward the perimeter.

A method of manufacturing an IC module in a second aspect of the present invention, including a resin packaging process using upper and lower dies for forming a cavity while the dies are clamped, is characterized in that the resin packaging process is carried out by introducing a melted resin while a substrate on which an IC chip is placed and a coil which is electrically connected to the IC chip and is flattened as a whole are housed in the cavity.

In the manufacturing method, a flattened coil, that is, a coil having a small thickness is used. When a melted resin is introduced into the cavity while the coil is housed, flow of the melted resin from the periphery of the cavity to the center is hardly hindered by the coil, and the melted resin can flow smoothly in the cavity.

Especially when such a coil is adopted that is formed to a tapered shape so that the cross section of the perimeter portion decreases in thickness toward the perimeter, the melted resin can flow more smoothly, and the melted resin can be distributed to the portions over and under the coil and spread in the entire cavity. It can prevent formation of a void and a pinhole in the resin package at the end of designing. Since the flow of the melted resin is distributed to the portions over and under the coil, the coil will not excessively be lifted upward. Further, since the resin can be set while it sufficiently flows to an upper portion of the coil, the coil can not be exposed from the surface of the resin package or it can not easily be exposed at the end of designing.

An IC module in a third aspect of the present invention, formed by packaging, with a resin, a substrate, an IC chip placed on the substrate, and an antenna coil electrically connected to the IC chip, is characterized in that a spacer having an equal or almost equal height to the thickness of the resin package is formed on the substrate.

In a preferred embodiment, the spacer is formed of a material having the same or similar physical properties to those of the packaging resin.

A method of manufacturing an IC module in a fourth aspect of the present invention, including a resin packaging process using upper and lower dies for forming a cavity while the dies are clamped, is characterized in that the resin packaging process is carried out by introducing a melted resin while a substrate on which an IC chip is placed, an antenna coil electrically connected to the IC chip is patterned, and a spacer having an equal or almost equal height to the height of the cavity is formed is housed in the cavity.

In the manufacturing method, a substrate on which a spacer is formed is packaged with a resin. In short, when the spacer height is designed corresponding to the cavity height, the spacer is arranged to vertically extend in the cavity by clamping the dies while the substrate is housed in the cavity. Since the substrate is thus pressed against the lower die, the substrate is prevented from warping to a dish shape due to heat of the die, and this situation is maintained till the end of the resin packaging process. Therefore, the melted resin can not flow under the back surface of the substrate, the IC chip can not be lifted upward, and the IC chip can not be exposed from the surface of the resin package at the end of resin molding.

Further, a spacer that is formed of a material having the same or similar physical properties to those of the packaging resin can be adopted. In this case, the spacer and the resin package match well, preventing, for example, stripping of the resin package around the spacer after molding.

A method of manufacturing an IC module in a fifth aspect of the present invention, including a resin packaging process carried out by introducing a melted resin into a cavity while a substrate on which an IC chip is placed and an antenna coil electrically connected to the IC chip is patterned is housed in the cavity which is formed while upper and lower dies are clamped, is characterized in that the substrate is sucked from the back surface side opposite to the surface of the substrate on which the IC chip is placed, in the resin packaging process.

According to the manufacturing method, the substrate can be drawn to the upper and lower surfaces of the cavity by sucking the substrate, and the melted resin can be introduced in this situation. Further, the substrate can remain to be pressed against the side and upper surfaces of the cavity without being warped till introduction of the melted resin ends and the resin material sets. In short, similar effects to those of the manufacturing method according to the fourth aspect can be attained.

A method of manufacturing an IC module in a sixth aspect of the present invention is characterized by the steps of patterning an antenna coil at a portion of a hoop shaped insulation film which is to be a substrate, mounting an IC chip to be electrically connected to a semiconductor coil, and carrying out a resin packaging process performed by using upper and lower dies for forming a cavity while the dies are clamped and sandwiching the film by the dies so that a region for forming the IC chip and the antenna coil is housed in the cavity.

In a preferred embodiment, a plurality of cavities and one or a plurality of plunger pots capable of supplying a melted resin into the cavities are formed while the dies are clamped, and the resin packaging process is carried out by introducing the melted resin from one plunger pot to a plurality of cavities.

In a preferred embodiment, the patterning step includes the steps of forming a metallic coating layer on the film and etching the metallic coating layer, and at least two rows of patterns may be formed in the width direction of the film.

In the manufacturing method, resin packaging is not carried out while an IC chip is placed on a substrate which is formed to a prescribed shape but it is carried out while an IC chip is placed on a hoop shaped insulation film. For example, the insulation film has engagement holes formed at regular intervals at the both side ends in the width direction, and pitch feeding or continuous feeding of the film is carried out when claws provided on a claw roller engage with the holes. Since constant tension is applied to the insulation film in the resin packaging process and the insulation film has a hoop shape in this case, the film will not be warped due to heat when a portion to be packaged with a resin is sandwiched by the dies.

Although the resin packaging process is carried out continuously as described above according to the present invention, the steps of patterning an antenna coil and mounting an IC chip may be carried out at the upstream of the portion where the resin packaging process of the insulation film is carried out, and the IC module may be punched from the insulation film at the downstream. Of course, patterning, mounting of an IC chip, and punching can be implemented automatically by using a prescribed device, and the resin packaging process can also be carried out automatically by using a die device. In short, automatic manufacturing of an IC module can be implemented according to the configuration.

An IC card in a seventh aspect of the present invention is characterized by the IC module in the first aspect described above. That is, the IC card which is formed by providing the card body with an IC module formed by packaging, with a resin, a substrate, an IC chip placed on the substrate, and a coil formed of a metallic wire is characterized in that the coil is electrically connected to the IC chip and is flattened as a whole.

An IC card in an eighth aspect of the present invention is characterized by the IC module in the third aspect described above. That is, the IC card which is formed by providing the card body with an IC module formed by packaging, with a resin, a substrate, an IC chip placed on the substrate, and a coil formed of a metallic wire is characterized in that a spacer having an equal or almost equal height to the thickness of the package is formed on the substrate.

In a preferred embodiment of the IC card in the seventh or eighth aspect above, the IC module is fit into the card body in which a through hole or a concave portion corresponding to the shape of the IC module is formed, and a cover sheet may be stuck on at least one surface of the card body.

Since the IC cards in the seventh and eighth aspects above include the IC module in the first or third aspect above, they can of course have the effects of the IC module in the first or third aspect. When the cover sheet is stuck on the surface of the card body, the IC card, especially the IC module can be protected effectively.

Other features and advantages of the present invention will be made apparent by the following detailed description in connection with the attached drawings.

BEST MODE FOR CARRIED OUT THE INVENTION

The preferred embodiments of the present invention will be described below in detail with reference to the drawings.

Figure 1:
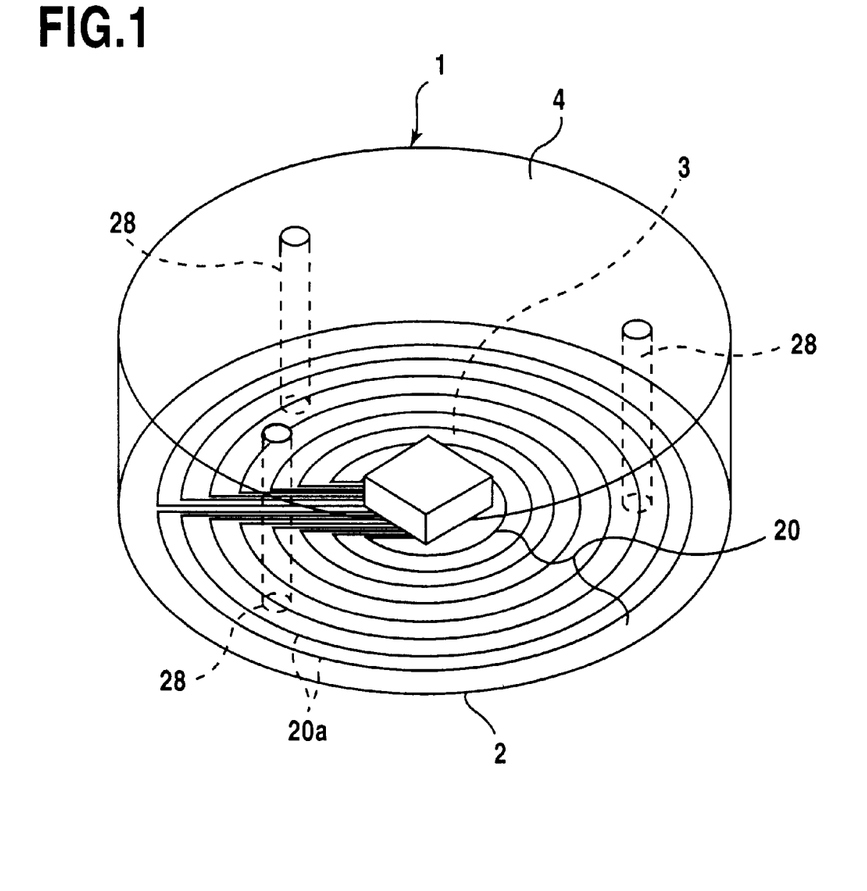
FIG. 1 is an overall perspective view of an IC module according to a first embodiment of the present invention.
Figure 2:
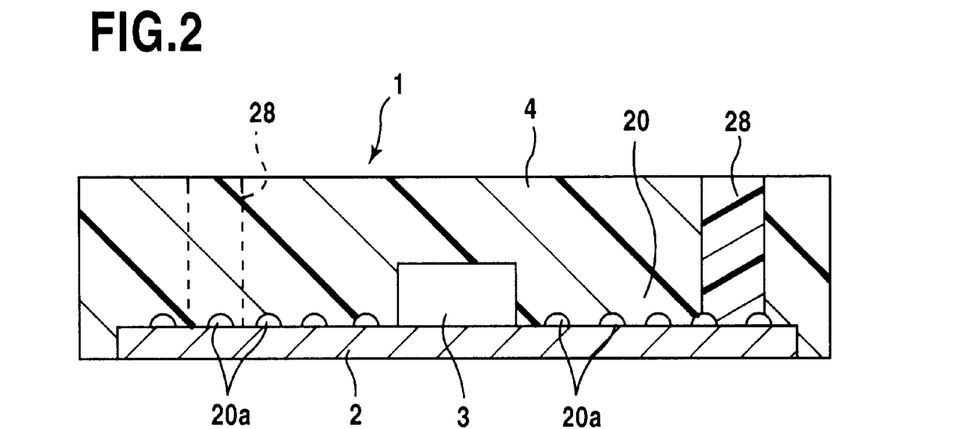
FIG. 2 is a cross sectional view of the IC module shown in FIG. 1.

As shown in FIGS. 1 and 2, an IC module 1 includes a circular substrate 2, an IC chip 3 placed on substrate 2, an antenna coil 20 formed on the surface of substrate 2, and a resin package 4 covering substrate 2 and IC chip 3, and the IC module is formed to a column shape as a whole.

Figure 3:
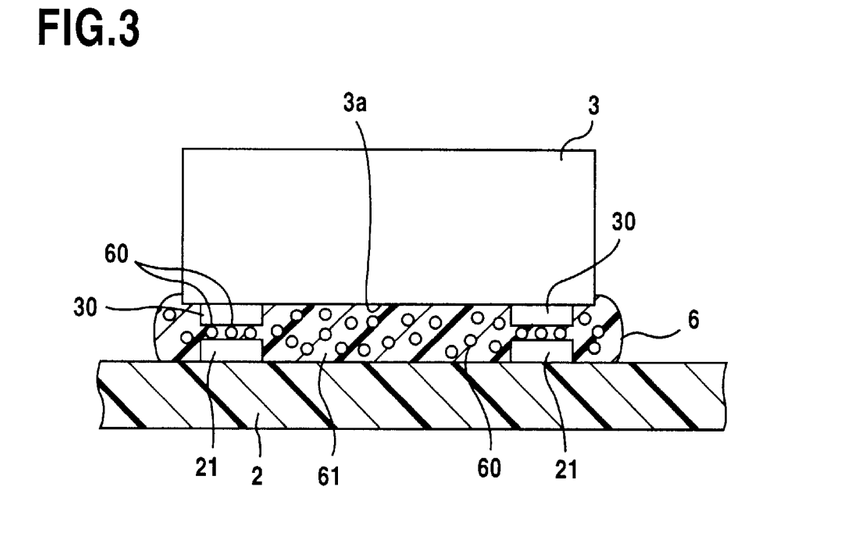
FIG. 3 is an enlarged cross sectional view of a main part of the IC module shown FIG. 1.

IC chip 3 has EEPROM memories, for example, and other condensers that are integrally formed, and the chip is formed to a rectangular parallelepiped shape as a whole as can be seen in FIG. 1. Here, IC chip 3 is mainly used as a memory having an information storage function. As shown in FIG. 3, antenna-connected electrodes 20, are formed on the main surface 3a of IC chip 3, and electrodes 30, are formed to protrude from main surface 3a by plating electrode pads knot shown) with gold.

Figure 4:
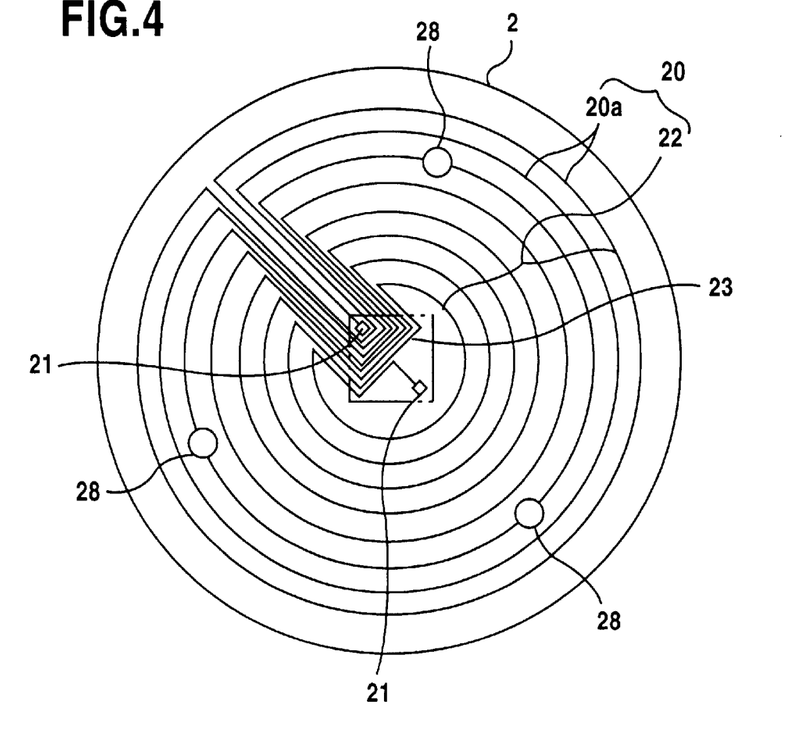
FIG. 4 is a plan view of a substrate forming the IC module shown in FIG. 1.

As shown in FIG. 4, substrate 2 is formed to a circular shape by using a resin such as a polyimide film that has flexibility and insulating properties. The shape of substrate 2 is not always circular but it may be elliptical, oval, or rectangular, for example. The shape is selected as appropriate. As can be seen in FIG. 4, on the surface of substrate 2, a prescribed pattern is formed of a conductor wire 20a to produce antenna coil 20, and the pattern is spiral as a whole and extends so that a prescribed portion of a conductor wire bundle 22 bends in a concave shape and radially enters substrate 2. The beginning and finishing ends of conductor wire 20a are arranged so that they sandwich conductor wire bundles 22 at the center where IC chip 3 is placed, and they are electrically connected to lands 21, which are formed to protrude at the center of substrate 2. The pattern is formed by an etching process after formation of a coating, for example, of copper, and lands 21, can also be formed in the same process. Although not shown, substrate 2 is covered, for example, with a polyimide resin to protect the pattern so that lands 21, face each other.

As shown in FIG. 3, IC chip 3 is mounted so that it is electrically connected to lands 21, formed on substrate 2. An anistropic conductive film 6 is used, for example, and anistropic conductive film 6 has a structure in which conductive particles 60 are scattered in a resin film 61 that has adhesive properties. When IC chip 3 is to be mounted by using anistropic conductive film 6, anistropic conductive film 6 is placed between IC chip 3 and substrate 2 and, in this condition, prescribed pressure is applied between IC chip 3 and substrate 2 in an initial state. Further, a "solder reflow" method may be adopted for mounting IC chip 3.

In the above described structure, antenna coil 20 functions as a device for transmitting and receiving radio waves between IC chip 3 and the outside, and a data signal is transmitted and received over the carriers of the radio waves. Since antenna coil 20 is formed to a spiral shape in which conductor wire 20a rotates in one direction, it also functions as a coil which causes inductive electromotive force by the electromagnetic induction effect and supplies the produced electromotive force to IC chip 3. The electromotive force supplied to IC chip 3 is stored in a condenser. In short, the above described structure has an advantage that a power supply such as a battery is not required.

In resin package 4, a plurality of spacers 28 which are formed to a column shape by resin molding are arranged to vertically penetrate resin package 4. Preferably, at least three spacers 28 are arranged and they are formed of a material that has the same or similar physical properties to those of resin package 4. Here, resin package 4 is formed by transfer molding using a thermoset resin or injection molding using a thermoplastic resin, as an example.

Figure 5:
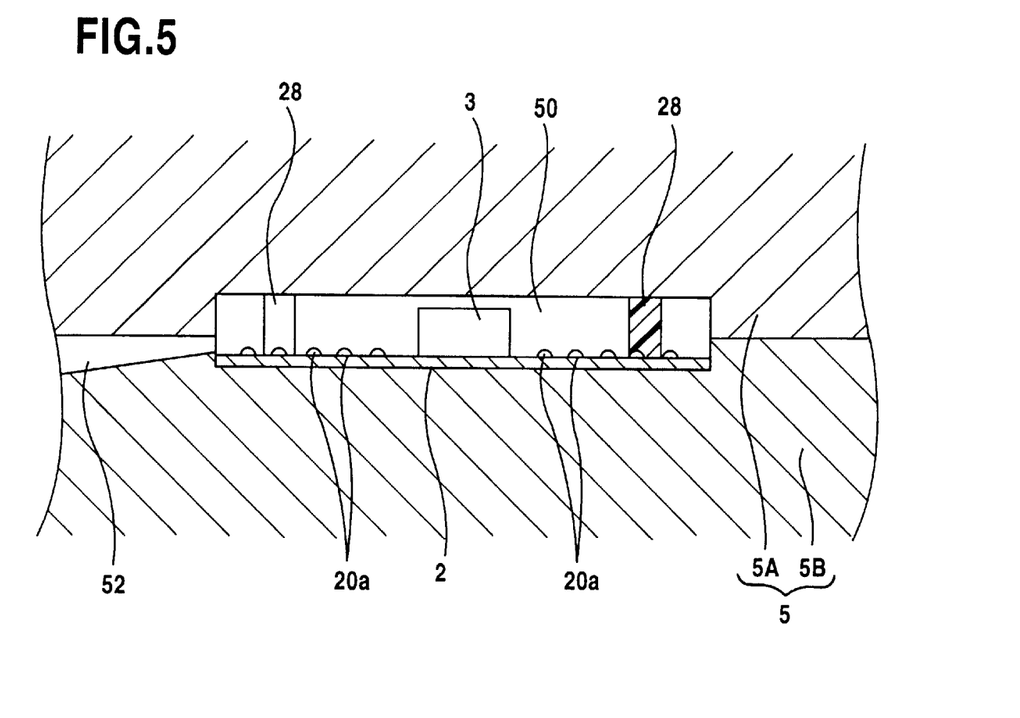
FIG. 5 is a view for describing the resin packaging process of the IC module shown in FIG. 1.

A method of manufacturing IC module 1 will be described briefly in the following with reference to FIGS. 4 and 5.

First, a copper coating is formed on the surface of substrate 2 which is, for example, of a polyimide resin having insulating properties and an unnecessary portion of the copper coating is removed by etching using an agent to form the pattern of conductor wire 20a which is spiral as a whole and lands 21, which are electrically connected to the pattern. In other words, the pattern of conductor wire 20a is made antenna coil 20. The copper coating is formed, for example, by sticking a copper foil, sputtering, deposition or CVD.

Then, IC chip 3 is mounted on lands 21, 21. The chip can be mounted by appropriately selecting the method using anistropic conductive film 6 as described above or the method of well-known solder reflow. Further, spacer 28 that is formed, for example, to a column shape by resin molding is arranged on substrate 2. Spacer 28 is formed to have an almost equal height to the vertical height of a cavity 50 which is formed while dies 5 described below are clamped, and at least three spacers are preferably arranged and formed of a resin which has the same or similar physical properties to those of resin package 4. Antenna coil 20 as shown in FIG. 4 and substrate 2 on which IC chip 3 is placed are formed in this manner. Here, substrate 2 may be formed by carrying out punching in advance and patterning the thus formed column shape, for example, or it may be formed to a circular shape by carrying out punching when the resin packaging process is to be carried out after patterning.

Subsequently, substrate 2 that has been processed as described above is housed in cavity 50 which is formed by dies 5A, 5B and clamped, and a melted resin is introduced into cavity 50 through a gate 52. Thus, resin package 4 is formed. When the melted resin sets and resin package 4 is formed, the package is taken out of dies 5 to form IC module 1 as shown in FIG. 1. Here, the resin packaging process is carried out by injection molding using a thermoplastic resin or transfer molding using a thermoset resin as described above.

In the resin packaging process of the manufacturing method described above, a substrate on which a spacer is formed is adopted as substrate 2. In other words, when the height of spacer 28 is set corresponding to the height of cavity 50, spacer 28 is arranged to vertically extend in cavity 50 by clamping the dies while substrate 2 is housed in cavity 50 as can be seen in FIG. 5. Since, substrate 2 is thus pressed against lower die 5B, substrate 2 can never warp to a dish shape due to heat from dies 5, and this state is maintained till the end of the resin packaging process. This prevents flow of the melted resin under the back surface of substrate 2 and of course prevents uplifting of IC chip 3. Further, IC chip 3 can not be exposed from the surface of resin package 4 at the end of resin molding.

When a spacer which is formed of a material having the same or similar physical properties to those of the package resin is adopted as spacer 28, spacer 28 easily matches with resin package 4, and stripping of resin package 4 around spacer 28 after molding can be prevented.

Figure 6:
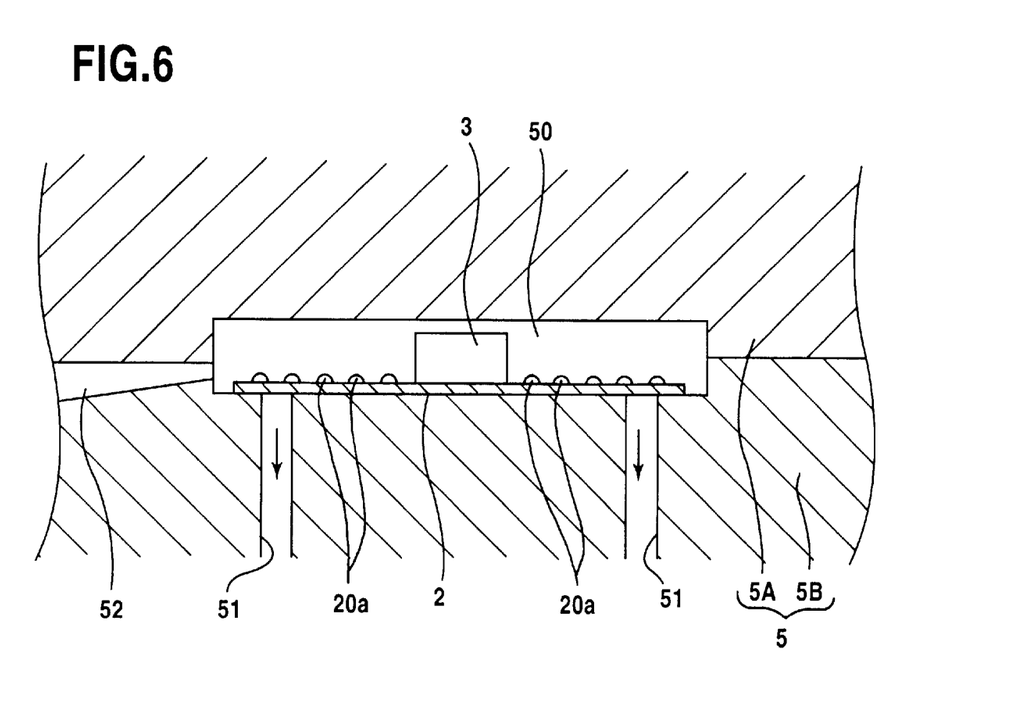
FIG. 6 is a view for describing a variation of the resin packaging process of the IC module shown in FIG. 1.

In carrying out the resin packaging, the method of causing substrate 2 to extend along the bottom surface of the cavity of lower die 5B is of course not limited to the above described embodiment. For example, the perimeter portion of substrate 2 may be sucked while substrate 2 on which IC chip 3 and the like are placed is provided on the bottom surface of the cavity of lower die 5B as shown in FIG. 6. In this case, substrate 2 is sucked through a hole 51, and approximately three or more holes 51 are preferably provided similarly to spacers 28 described above. Substrate 2 is sucked till the melted resin sets, preferably, till the temperature of the formed resin package 4 attains a normal temperature. When the resin packaging is carried out by sucking substrate 2 in this manner, flow of the melted resin under the back surface of substrate 2 and resulting uplifting of IC chip 3 are prevented as in the embodiment described above. When substrate 2 is sucked till resin package 4 comes to have a normal temperature, warping of resin package 4 due to a difference in the coefficient of heat contraction between substrate 2 and resin package 4 is prevented.

The basic structure of IC module 1 according to the embodiment is almost the same as IC module 1 according to the first embodiment described above. In short, lands 21, are formed, for example, of copper on substrate 2 which is formed, for example, of a polyimide film, and IC chip 3 is placed on lands 21. In the embodiment, a coil 20A is adopted as antenna coil 20 unlike the first embodiment described above.

Figure 7:
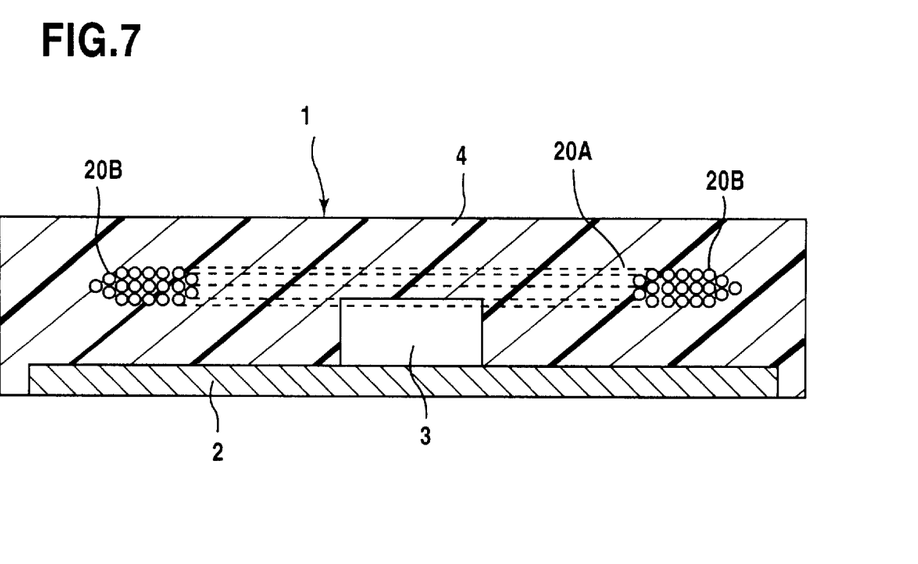
FIG. 7 is a cross sectional view of an IC module according to a second embodiment of the present invention.

As shown in FIG. 7, coil 20A has a doughnut shape when observed from above, and the coil is flattened as a whole. Further, the cross section of perimeter 20B of coil 20A is formed to a tapered shape that decreases in thickness toward the perimeter. The coil 20A is formed by winding a metallic wire, for example, around a column-shaped rod ten times to several tens of times. Although not shown in the drawing, the beginning and finishing ends of coil 20A are connected to a conductor pad or the like formed on substrate 2, and the conductor pad is electrically connected to lands 21.

Figure 8:
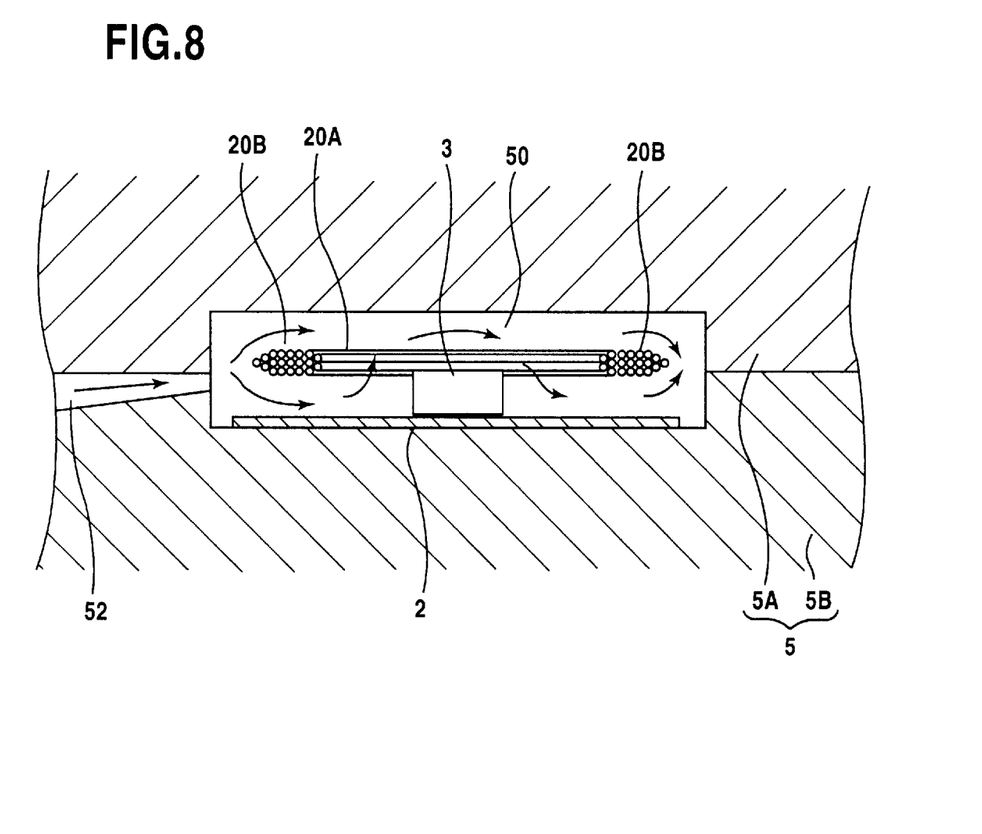
FIG. 8 a view for describing the resin packaging process of the IC module shown in FIG. 7.

A method of manufacturing IC module 1 will be described briefly in the following with reference to FIG. 8.

First, a copper coating is formed in a similar manner to the first embodiment described above on the surface of substrate 2, for example, of a polyimide resin with insulating properties, and an unnecessary portion of the copper coating is removed by etching using an agent to form lands 21 on which IC chip 3 is mounted and a conductor pad which is electrically connected to lands 21. Here, substrate 2 may be formed by patterning a circular shape, for example, which is punched in advance, or the substrate may be formed, for example, to a circular shape by carrying out punching when resin package 4 is to be formed after patterning or the like.

Then, IC chip 3 is mounted on lands 21. The lands can be mounted by properly selecting the method using anistropic conductive film 6 described above or the method of well-known solder reflow.

Thereafter, substrate 2 which has been processed as described above and coil 20A are housed in cavity 50 which is formed by dies 5A, 5B, the dies are clamped, and a melted resin is introduced into cavity 50 through gate 52 to form resin package 4. When the melted resin sets and resin package 4 is formed, IC module 1 as shown in FIG. 7 is formed by taking it out of dies 5. Here, the resin packaging process is carried out by injection molding using a thermoplastic resin or transfer molding using a thermoset resin.

In the manufacturing method, a flattened coil, that is, a coil having a small thickness is used as coil 20A. When a melted resin is introduced into cavity 50 while coil 20A is housed, therefore, flow of the melted resin from the perimeter of cavity 50 to the center is not easily prohibited, and the melted resin can flow smoothly in cavity 50.

Especially when coil 20A of which cross section of perimeter 20B is formed to a tapered shape which decreases in thickness toward the perimeter is adopted, the melted resin can flow more smoothly. As can be seen in FIG. 8, the melted resin can be distributed to the portions over and under coil 20A and spread throughout cavity 50. Accordingly, formation of a void or a pinhole at the end of molding can be prevented. Since the flow of the melted resin is distributed to the portions over and under coil 20A, coil 20A will not be lifted unnecessarily, and the resin can set while it sufficiently flows to an upper portion of coil 20A. Accordingly, coil 20A can not be exposed from the surface of resin package 4 or it can not be easily exposed at the end of molding.

The method of manufacturing IC module 1 according to the embodiment includes the steps of patterning antenna coil 20 and lands electrically connected to the antenna coil in a portion which is to be substrate 2 on hoop-shaped insulation film 2A, mounting IC chip 3 on lands 21 and carrying out resin packaging using a die device for molding.

Figure 11:
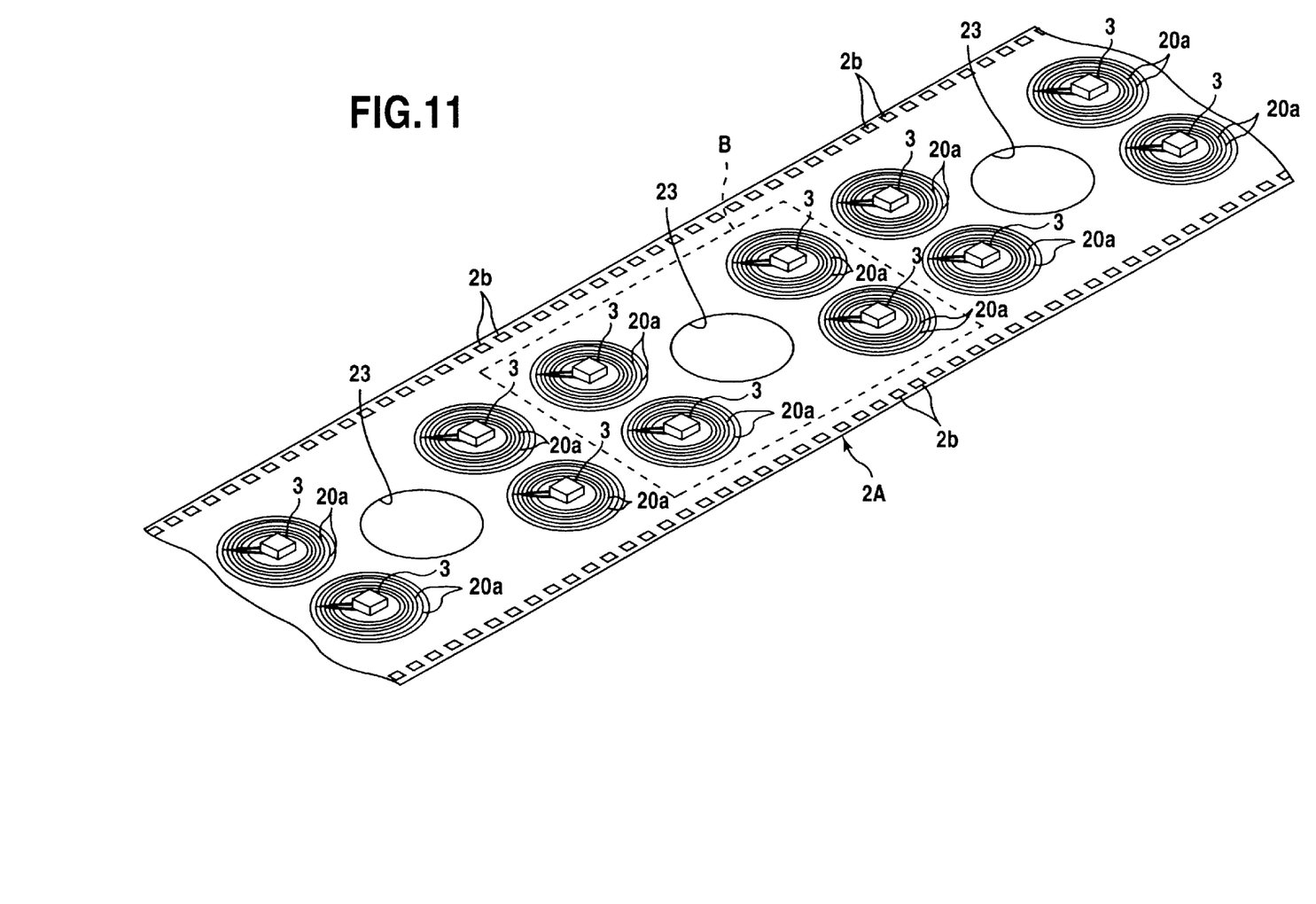
FIG. 11 is a perspective view showing an insulation film on which an antenna coil is patterned and an IC chip is placed.

As shown in FIG. 11, insulation film 2A is formed to a hoop shape by using a polyimide resin, for example, and has holes 23 formed longitudinally at regular intervals and a plurality of engagement holes 2b formed at regular intervals at the both side end., in the width direction. In short, insulation film 2A is formed so that pitch feeding or continuous feeding is carried out when claws provided on a claw roller (not shown) engage with the engagement holes.

The patterning step is carried out by providing etching using an agent to leave a desired portion after formation of a coating, for example, of copper as in the embodiment described above. In the embodiment, two rows of patterns are formed in the width direction.

IC chip 3 is mounted by the method using anistropic conductive film 6 described above or the method of well-known solder reflow.

The resin packaging process is carried out by injection molding or transfer molding using a prescribed die device for molding. When resin packaging is to be performed by transfer molding as an example, such die device for molding is adopted that includes upper and lower dies 5A, 5B with lower die 5B attached to a movable board which can vertically move such as by hydraulic pressure and upper die 5A attached to the bottom surface of a floating board which goes up when the movable board rises.

Figure 9:
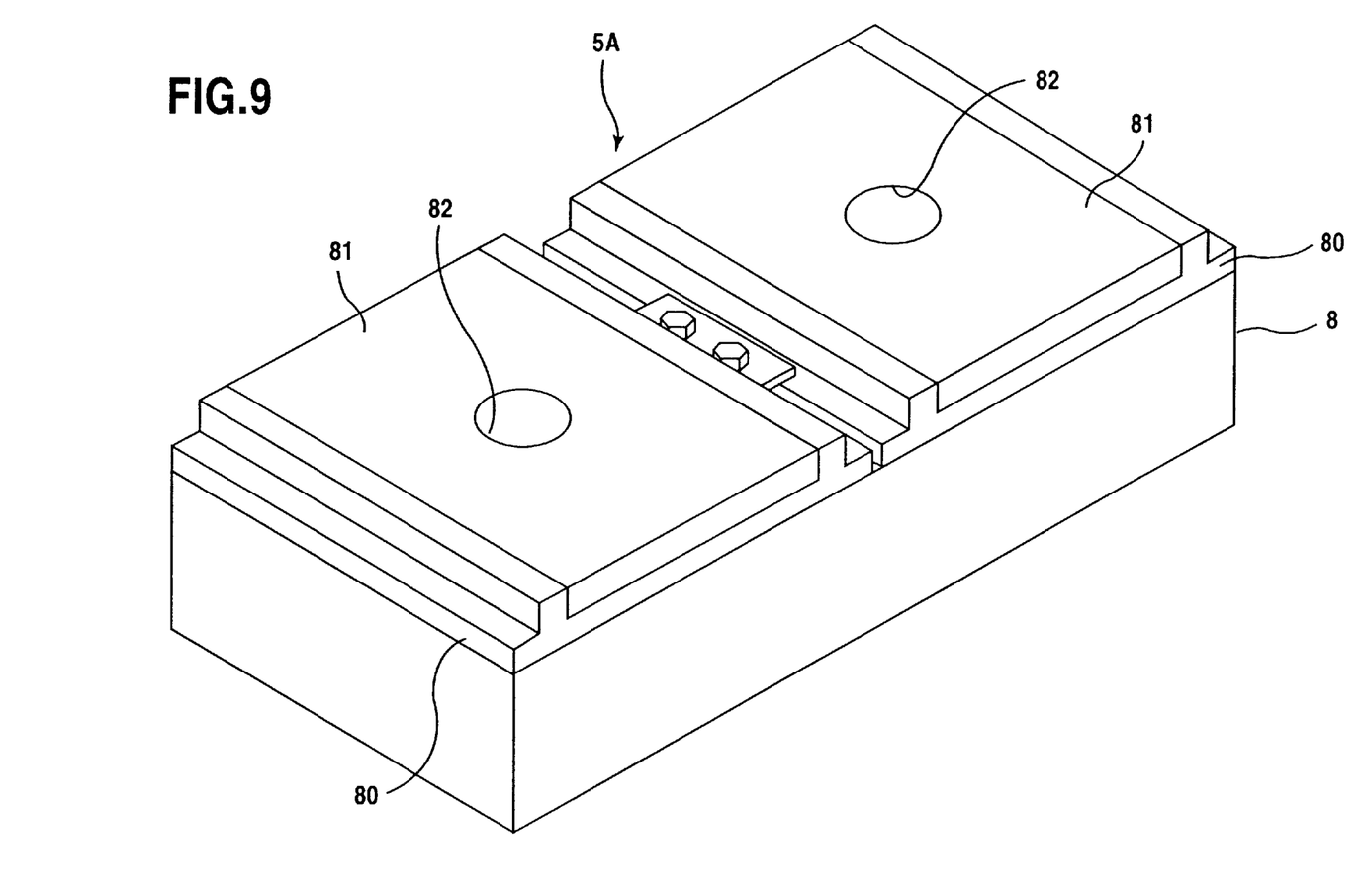
FIG. 9 is an overall perspective view of an upper die used in a resin packaging process in a method of manufacturing an IC module according to a third embodiment of the present invention.
Figure 12:
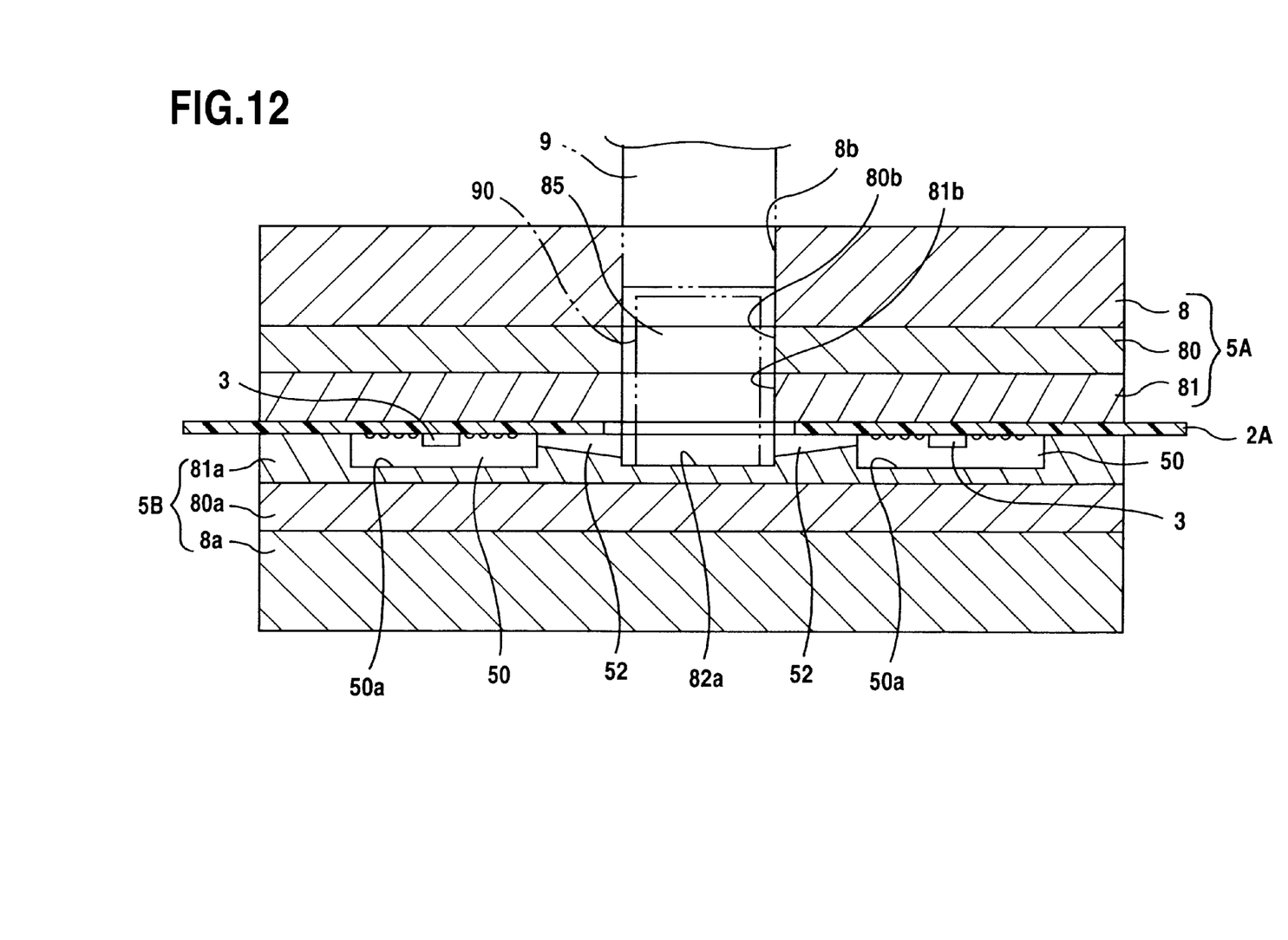
FIG. 12 is a cross sectional view of a state in which the dies are clamped to sandwich the insulation film shown in FIG. 11.

For, example, the structure as shown in FIG. 9 is adopted as upper die 5A. That is, upper die 5A includes a base plate 8 attached to the bottom surface of the floating board, and a chase block 81 attached to the bottom surface of base plate 8 with a frame body 80 placed therebetween. As can be seen in FIG. 12, through holes 8b, 80b, 81b which are of column shape, for example, are formed in members 8, 80, 81 and, when members 8, 80, 81 are attached to the floating board, a hole for forming a plunger pot 85 is formed by through holes 8b, 80b, 81b.

Figure 10:
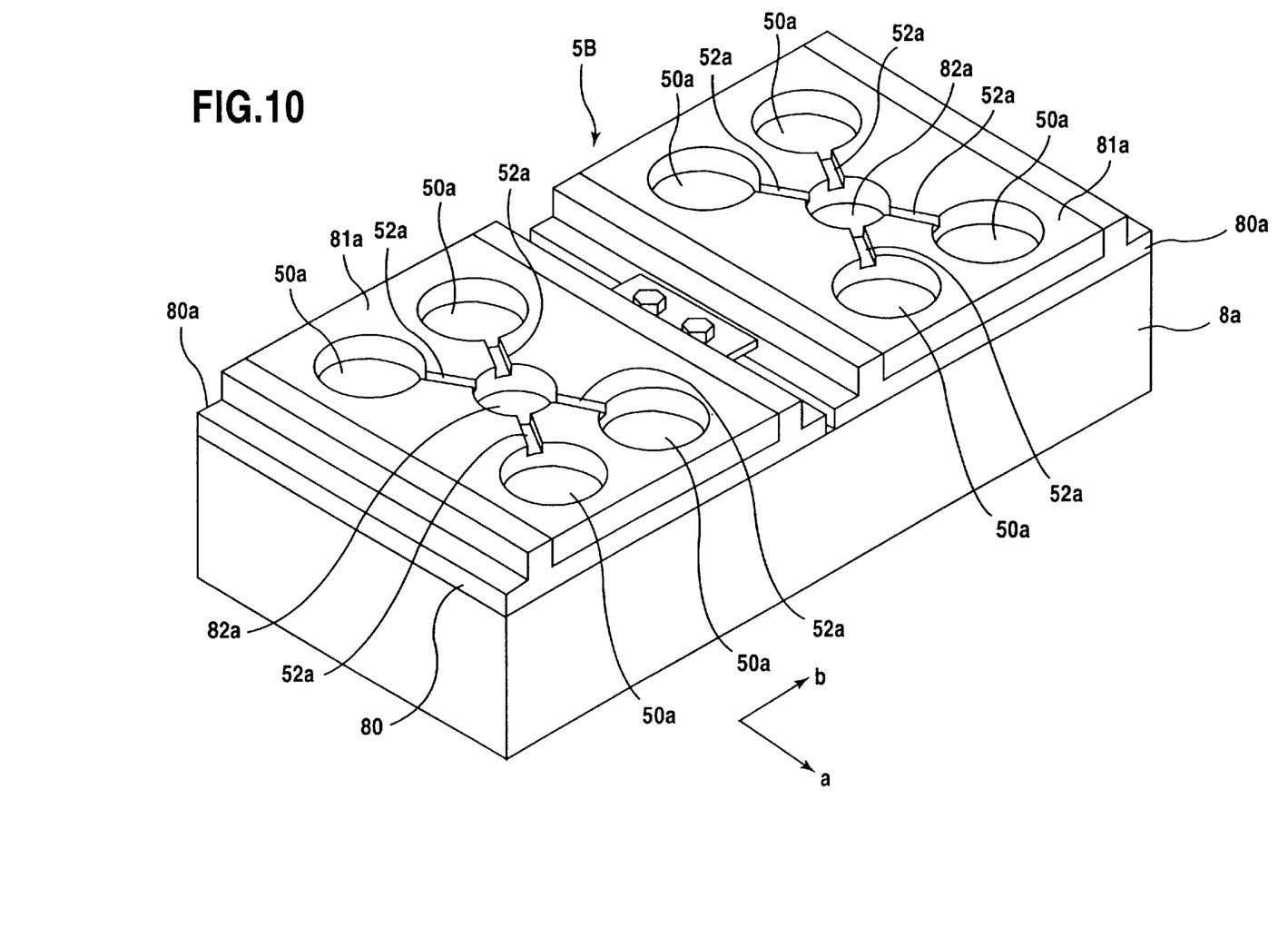
FIG. 10 is an overall perspective view of a lower die used in the resin packaging process of the IC module shown in FIG. 9.

The structure as shown in FIG. 10 is adopted as lower die 5B. That is, lower die 5B includes a base plate 8a attached to the top surface of the movable board, and a chase block 8 1a attached to the top surface of base plate 8a with a frame body 80a placed therebetween. As shown in FIG. 10, chase block 81a has a concave portion 82a formed at the center and four cavities 50a, for example, which are connected to concave portion 82a through runner grooves 52a are formed in a concave manner. When dies 5A, 5B are clamped, concave portion 82a connects to the hole formed in upper die 5A and forms plunger pot 85.

In the die device for molding formed as described above, the resin packaging process is carried out as described below.

First, as shown in FIG. 12, dies 5 are clamped so that IC chip 3 and antenna coil 20 on insulation film 2A are housed in cavity 50 which is formed while dies 5A, 5B are clamped, that is, so that a rectangular region surrounded by the dotted line in FIG. 11 is sandwiched by dies 5A, 5B while IC chip 3 protrudes downward.

Then, a resin tablet 90 is filled in plunger pot 85 that is formed while dies 5 are clamped. At this time, resin tablet 90 melts because dies 5 are preheated to a prescribed temperature. The melted resin is pressurized by a plunger 9 that is inserted into plunger pot 85, and the resin is introduced into each cavity 50 through each runner 52.

Thereafter, the introduced melted resin spreads in cavity 50, dies 5A, 5B are separated if the resin sets, and a portion which is to be IC module 1 is cut from insulation film 2A such as by punching. Thus, IC module 1 is obtained.

In the manufacturing method above, insulation film 2A which is subjected to pitch feeding by rotation of a hoop-shaped claw roller provided with engagement holes 26 is adopted. Therefore, the packaging step can be carried out continuously by successively causing pitch feeding of insulation film 2A. In this case, two rows of insulation films 2A may be arranged in the direction denoted by the arrow B in FIG. 10 and eight IC chips 3 may be packaged with a resin for each pitch feeding of insulation films 2A, 2A in the direction denoted by the arrow a. Further, eight IC chips 3 may be packaged with a resin at a time by pitch feeding in the direction denoted by the arrow B.

Besides, the number of IC chips which can be packaged at a time may be increased by increasing the number of cavities 50a formed in chase block 81a, or by increasing chase blocks 80, 81a attached to base plates 8, 8a.

In the resin packaging process as described above, insulation film 2A is supplied with constant tension and is formed to a hoop shape, and therefore the film will not be warped when a portion to be packaged with a resin is sandwiched by dies 5.

Although the resin packaging process can be carried out continuously according to the manufacturing method described above, antenna coil 20 may be patterned and IC chip 3 may be mounted on the upstream side of a portion where insulation films 2A is packaged with a resin, and IC module 1 may be punched from insulation film 2A on the downstream side. Patterning, mounting of IC chip 3, and punching can be performed automatically by using a prescribed device, and the resin packaging process can also be performed automatically by using a die device. In short, automatic manufacturing of IC module 1 can be achieved according to the configuration.

Figure 13:
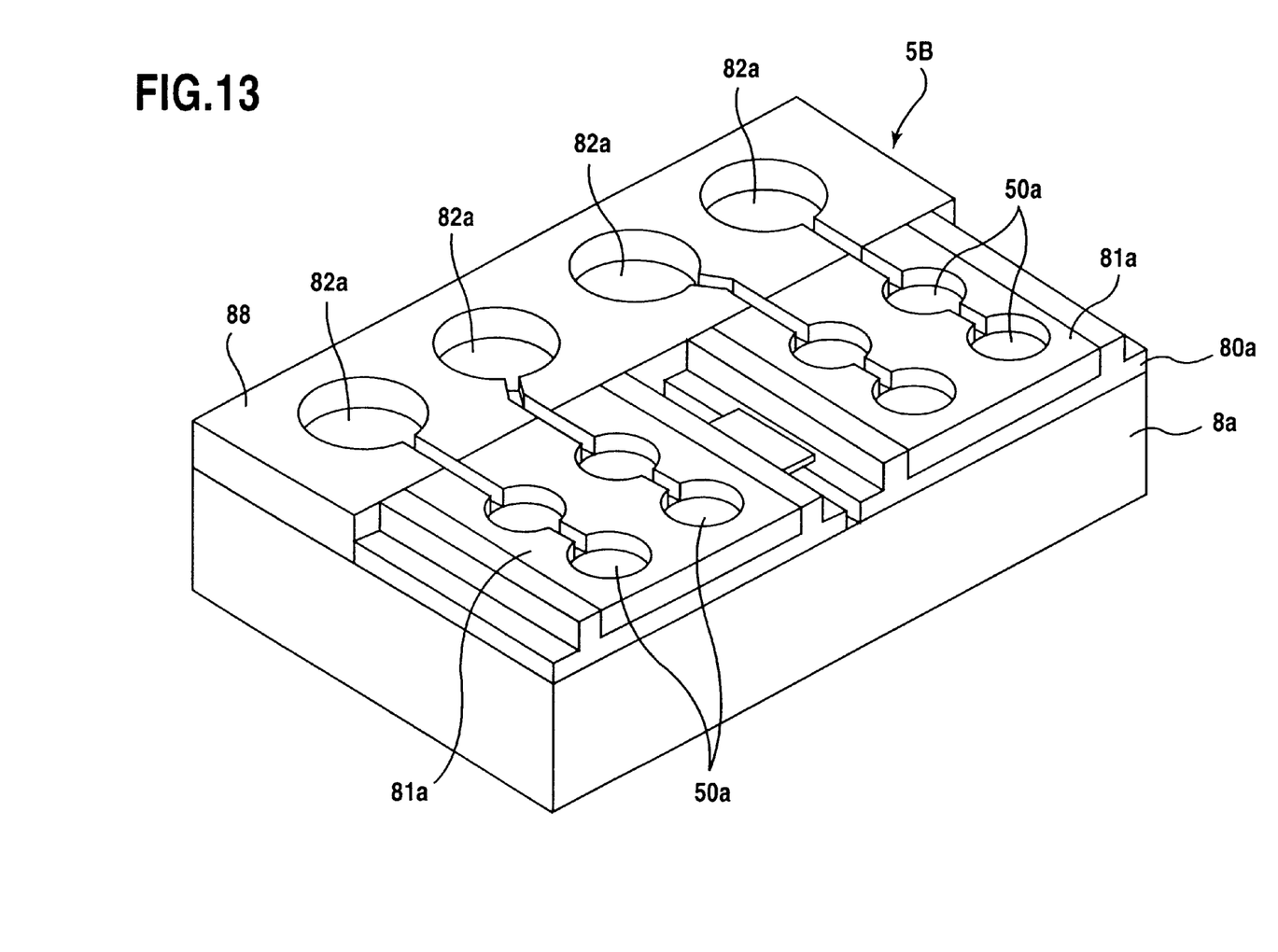
FIG. 13 is an overall perspective view showing a variation of the upper die.

The structure as shown in FIG. 13 can be adopted as lower die 5B. Lower die 5B here differs from lower die 5B shown in FIG. 10 in that concave portion 82a for forming plunger pot 85 which is formed while dies 5 are clamped is not formed in chase block 81a and it is formed in a center block 88 attached to base plate 8a. In lower dies 5B here, a melted resin is not introduced from one plunger pot 85 to four cavities 59 but from one plunger pot 85 to two cavities 59, and resin packaging is carried out by pitch feeding of insulation film 2A in a parallel direction to the row of plunger pots 85. When the resin packaging process is carried out by adopting lower die 5B having the structure above, therefore, formation of a hole 23 for plunger pot 85 in insulation film 2A :is not necessary.

In the above described embodiment, a melted resin is introduced while IC chip 3 is housed in cavity 50 so that it protrudes downward. However, resin packaging may be performed by clamping dies 5 while IC chip 3 protrudes upward. In this case, modification of the die structure is of course necessary.

Figures 14, 15:
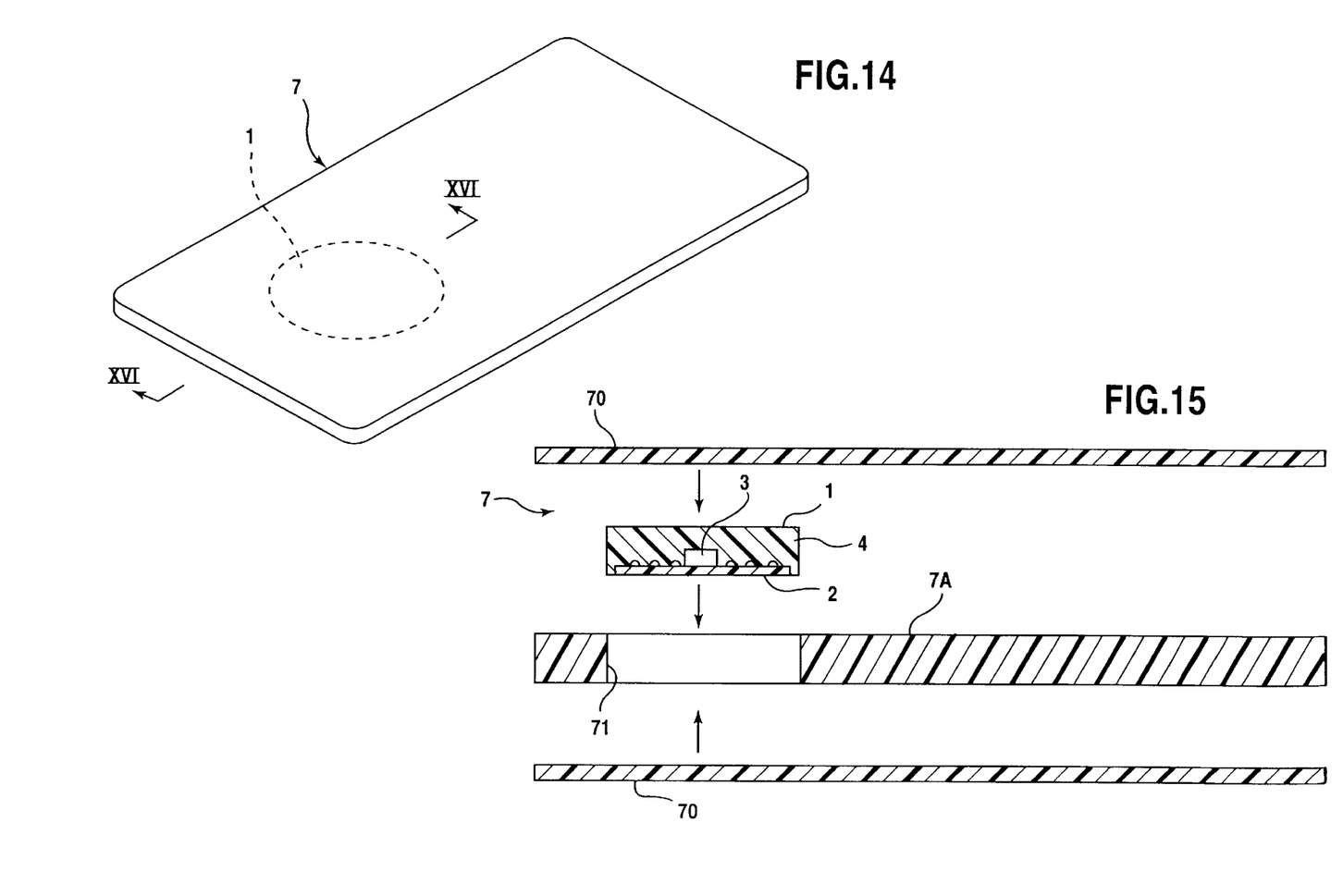
FIG. 14 is an overall perspective view of an IC card according to the present invention.
FIG. 15 is an exploded side view of the IC card shown in FIG. 14.
Figure 16:
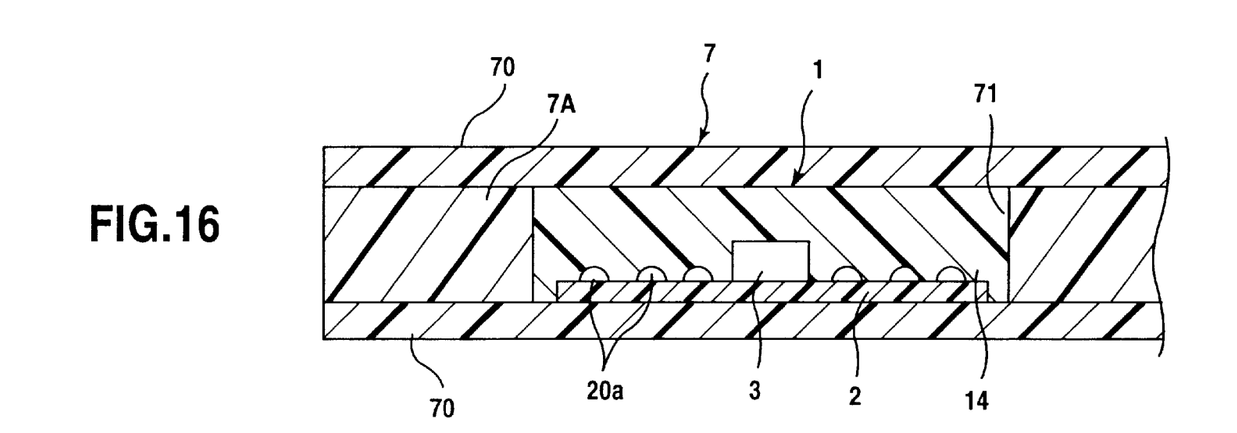
FIG. 16 is a cross sectional view taken along the line XVI—XVI in FIG. 14.
Figure 17:
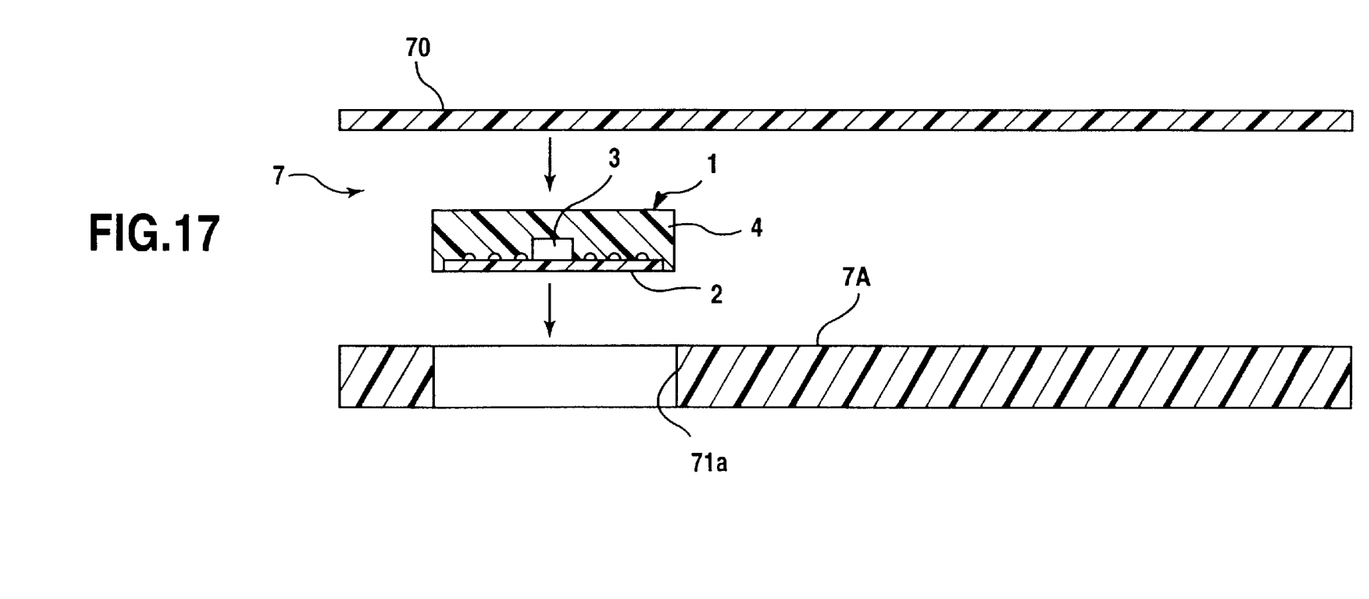
FIG. 17 is an exploded side view of a variation of the IC card shown in FIG. 14.

As shown in FIGS. 15 and 16, IC card 7 includes IC module 1 according to either embodiment described above, a card body 7A in which IC module 1 is fit, and cover sheets 70, 70 which are stuck on the top and bottom surfaces of card body 7A. As shown in FIG. 14, IC card 7 has a rectangular shape when observed from above, and it is formed to have a thickness of about 0.76 mm with the thickness of an adhesive described below included.

In card body 7A, a through hole 71 which has a column shape corresponding to the shape of IC module 1 and in which IC module 1 is fit is formed at a portion longitudinally shifted from the center. Card body 7A is formed to have a thickness of about 0.45 mm by using a polyethylene terephthalate (hereinafter, referred to as "PET") resin, polyvinyl chloride (hereinafter, referred to as "PVC") or the like.

Cover sheets 70, are formed to have a thickness of about 0.15 mm by using a resin such as PET or PVC, and they ire stuck on the top and bottom surfaces of card body 7A with an adhesive, for example. IC module 1 can be protected by sticking cover sheets 70, As shown in FIG. 16, IC module 1 is fit into through hole 71 of card body 7A, sandwiched by cover sheets 70, and inscribed with card body 7A. When module 1 is to be fit into through hole 70, an adhesive, for example, of an epoxy resin may be used and the method may be selected as appropriate.

IC card 7 is not limited to the structures of the embodiments described above. As shown in FIG. 16, a concave portion 71a may be formed instead of through hole 71 in card body 7A. In this case, cover sheet 70 only has to be stuck on at least the surface having the opening side of concave portion 71a.

What is claimed is:

1. An IC module, comprising:
a substrate having a first surface and an opposite second surface and extending radially to define a peripheral boundary;
an IC chip connected to the first surface of the substrate;
an antenna coil assembly electrically connected to the IC chip and disposed apart from the first surface of the substrate, the antenna coil assembly including a plurality of sequentially connected coil segments coiled axially and radially besides and about one another, the antenna coil assembly disposed within the peripheral boundary of the substrate; and
a resin package encasing at least the first surface of the substrate, the IC chip and the antenna coil assembly, wherein axial outer ones of the coil segments are disposed within respective flat radially-extending planes and radial outer ones of the coil segments reducing in number commencing radially inwardly and terminating radially outwardly to form in cross-section a substantially tapered outer periphery of the antenna coil assembly.

2. An IC module, comprising:
a substrate having a first surface and an opposite second surface and extending radially to define a peripheral boundary;
an IC chip connected to the first surface of the substrate;
an antenna coil assembly electrically connected to the IC chip and including a plurality of coil segments coiled relative to one another, the antenna coil assembly disposed within the peripheral boundary of the substrate;
a plurality of spacers disposed interiorly of the peripheral boundary of the substrate and having a first end and an opposite second end defining a spacer height therebetween, the first ends of each spacer connected to the first surface of the substrate and being in contact with at least one coil segment, the second end extending above the IC chip and antenna coil assembly; and
a resin package encasing at least the first surface of the substrate, IC chip and antenna coil assembly to define a resin thickness, wherein the height of the spacers are either equal or substantially equal to the resin thickness.

3. An IC card, comprising:
a card body; and
an IC module embedded into the card body, the IC module including:
a substrate having a first surface and an opposite second surface and extending radially to define a peripheral boundary;
an IC chip connected to the first surface of the substrate;
an antenna coil assembly electrically connected to the IC chip and disposed apart from the first surface of the substrate, the antenna coil assembly including a plurality of sequentially connected coil segments coiled axially and radially besides and about one another, the antenna coil assembly disposed within the peripheral boundary of the substrate; and
a resin package encasing at least the first surface of the substrate, the IC chip and the antenna coil assembly, wherein axial outer ones of the coil segments are disposed within respective flat radially-extending planes and radial outer ones of the coil segments reducing in number commencing radially inwardly and terminating radially outwardly to form in cross-section a substantially tapered outer periphery of the antenna coil assembly.

4. An IC card, comprising:
a card body; and
an IC module embedded into the card body, the IC module including:
a substrate having a first surface and an opposite second surface and extending radially to define a peripheral boundary;
an IC chip connected to the first surface of the substrate;
an antenna coil assembly electrically connected to the IC chip and including a plurality of coil segments coiled relative to one another, the antenna coil assembly disposed within the peripheral boundary of the substrate;
a plurality of spacers disposed interiorly of the peripheral boundary of the substrate and having a first end and an opposite second end defining a spacer height therebetween, the first ends of each spacer connected to the first surface of the substrate and being in contact with at least one coil segment, the second end extending above the IC chip and antenna coil assembly; and
a resin package encasing at least the first surface of the substrate, IC chip and antenna coil assembly to define a resin thickness, wherein the height of the spacers are either equal or substantially equal to the resin thickness.

* * * * *

UNITED STATES PATENT AND TRADEMARK OFFICE
CERTIFICATE OF CORRECTION

PATENT NO. : 6,308,894 B1
DATED : October 30, 2001
INVENTOR(S) : M. Hirai et al.

It is certified that error appears in the above-identified patent and that said Letters Patent is hereby corrected as shown below:

<u>Title page,</u>
Item [73], Assignee, delete "Rohm & Co., Ltd." and change to -- Rohm Co., Ltd. --.

Signed and Sealed this

Thirteenth Day of August, 2002

*Attest:*

*Attesting Officer*

JAMES E. ROGAN
*Director of the United States Patent and Trademark Office*